United States Patent
Yoshimura et al.

(10) Patent No.: US 7,955,896 B2
(45) Date of Patent: Jun. 7, 2011

(54) METHOD OF MANUFACTURING STACKED SEMICONDUCTOR DEVICE

(75) Inventors: Atsushi Yoshimura, Yokosuka (JP); Shoko Omizo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 12/508,905

(22) Filed: Jul. 24, 2009

(65) Prior Publication Data

US 2010/0035381 A1 Feb. 11, 2010

(30) Foreign Application Priority Data

Aug. 6, 2008 (JP) ................................. 2008-202994

(51) Int. Cl.
*H01L 21/00* (2006.01)

(52) U.S. Cl. . 438/109; 438/123; 438/118; 257/E21.509; 257/E21.499

(58) Field of Classification Search .................. 438/109, 438/123, 118; 257/E21.509, E21.499
See application file for complete search history.

(56) References Cited

U.S. PATENT DOCUMENTS

| | | | |
|---|---|---|---|
| 6,353,263 B1 | 3/2002 | Dotta et al. | |
| 2005/0248019 A1 | 11/2005 | Chao et al. | |
| 2005/0253229 A1 | 11/2005 | Fukui et al. | |
| 2006/0139893 A1 | 6/2006 | Yoshimura et al. | |
| 2008/0197470 A1 | 8/2008 | Yoshimura et al. | |

FOREIGN PATENT DOCUMENTS

| | | |
|---|---|---|
| JP | 2004-158716 | 6/2004 |
| JP | 2006-005333 | 1/2006 |
| JP | 2007-324443 | 12/2007 |

OTHER PUBLICATIONS

JIS K7244-4, Plastics Determination of Dynamic Mechanical Properties Part 4: Tensile Vibration—Non-resonance Method, Oct. 20, 1999.
JIS K7117-2, Liquid, Emulsion-like or Dispersed Resin—Viscosity Measuring Method (Room-Temperature Measurement) by a Rotational Viscometer at a Fixed Shearing Speed, Aug. 20, 1999.

*Primary Examiner* — Tan N Tran
(74) *Attorney, Agent, or Firm* — Turocy & Watson, LLP

(57) ABSTRACT

A first semiconductor element is mounted on a wiring board. A second semiconductor element having a portion projecting to an outer side of an outer periphery of the first semiconductor element is disposed on the first semiconductor element via an adhesive. The adhesive has a viscosity ($\mu_{0.5\ rpm}$) at a low-rotation speed in a range from 10 Pa·s to 150 Pa·s and a thixotropic ratio of 2 or higher expressed by a ratio ($\mu_{0.5\ rpm}/\mu_{5\ rpm}$) of the viscosity ($\mu_{0.5\ rpm}$) at the low-rotation speed to a viscosity ($\mu_{5\ rpm}$) at a high-rotation speed. The second semiconductor element is bonded onto the first semiconductor element while the adhesive is filled in a hollow portion between the projecting portion of the second semiconductor element and the wiring board.

20 Claims, 9 Drawing Sheets

METHOD OF MANUFACTURING STACKED SEMICONDUCTOR DEVICE

CROSS-REFERENCE TO RELATED APPLICATIONS

This application is based upon and claims the benefit of priority from the prior Japanese Patent Application No. 2008-202994, filed on Aug. 6, 2008; the entire contents of which are incorporated herein by reference.

BACKGROUND OF THE INVENTION

In some stacked multichip packages (stacked semiconductor devices) in which a plurality of semiconductor elements are stacked and sealed in a package, a semiconductor element larger than a lower-side semiconductor element is stacked on an upper side, or a semiconductor element on an upper side is stacked in an offset manner. In such cases, part of the upper semiconductor element projects from an outer periphery of the lower semiconductor element, and an area under the projecting portion is hollow. If electrode pads provided on the projecting portion of the upper semiconductor element are wire-bonded, a load at this time bends the semiconductor element. Such bending may cause a crack of the semiconductor element or a connection failure of metal wires.

To solve this, it is effective to fill an adhesive bonding the upper semiconductor element to the lower semiconductor element, in the hollow portion under the projecting portion of the upper semiconductor element (see JP-A 2004-158716 (KOKAI) and JP-A 2006-005333 (KOKAI)). Further, there is also an increasing demand for a thinner multichip package. To realize this, it is effective to use an adhesive containing an insulating filler functioning as a spacer. JP-A 2006-005333 (KOKAI) describes that the adhesive containing the insulating filler functioning as the spacer is used, and the adhesive is filled in an area under the projecting portion of the upper semiconductor element while a gap between the upper semiconductor element and the lower semiconductor element is kept narrow.

At this time, by lowering the viscosity of the adhesive made of a thermosetting resin composition or the like, it is possible to uniformly fill the adhesive in the gap between the semiconductor elements, which can realize a stacking structure with a narrow inter-element gap. However, lowering the viscosity of the adhesive may possibly cause the rotation or movement (chip shift) of the upper semiconductor element when the upper semiconductor element is mounted (is pressed) or when the adhesive undergoes a curing process. Increasing the viscosity of the adhesive could prevent the chip shift but would not make it possible to uniformly spread the adhesive in the gap between the semiconductor elements even by the application of a load at the time of the bonding of the upper semiconductor element and to obtain a non-defective thinned package. The viscosity of the adhesive is in a trade-off relation with the reduction in the inter-element gap and the non-defective element stacking structure.

JP-A 2007-324443 (KOKAI) describes that an upper semiconductor element is bonded to a lower semiconductor element by using adhesive resin whose resin property expressed by a product of viscosity and thixotropic ratio is 700 or higher, and the adhesive is filled in a hollow portion under a projecting portion of the upper semiconductor element. Here, in filling the adhesive in the hollow portion under the projecting portion, based on the resin property expressed by the product of viscosity and thixotropic ratio, the adhesive is prevented from flowing out. However, no consideration is given to realizing both the reduction in the inter-element gap and the non-defective element stacking structure.

BRIEF SUMMARY OF THE INVENTION

A method of manufacturing a stacked semiconductor device according to an aspect of the present invention includes: bonding a first semiconductor element having first electrode pads onto a circuit base having connection parts; electrically connecting the connection parts of the circuit base and the first electrode pads via first metal wires; disposing a second semiconductor element having a portion projecting to an outer side of an outer periphery of the first semiconductor element and second electrode pads provided on at least the projecting portion, on the first semiconductor element via an adhesive; bonding the second semiconductor element onto the first semiconductor element by using the adhesive while filling the adhesive in a hollow portion between the projecting portion of the second semiconductor element and the circuit base; and electrically connecting the connection parts of the circuit base and the second electrode pads via second metal wires, wherein a viscosity ($\mu_{0.5\ rpm}$) of the adhesive measured with an E-type viscometer at 0.5 rpm is in a range from 10 Pa·s to 150 Pa·s, and a thixotropic ratio of the adhesive expressed by a ratio ($\mu_{0.5\ rpm}/\mu_{5\ rpm}$) of the viscosity ($\mu_{0.5\ rpm}$) of the adhesive at 0.5 rpm to a viscosity ($\mu_{5\ rpm}$) of the adhesive measured with the E-type viscometer at 5 rpm is 2 or more.

A method of manufacturing a stacked semiconductor device according to another aspect of the present invention includes: bonding a first semiconductor element having first electrode pads onto a circuit base having connection parts; electrically connecting the connection parts of the circuit base and the first electrode pads via first metal wires; disposing a second semiconductor element having a portion projecting to an outer side of an outer periphery of the first semiconductor element and second electrode pads provided on at least the projecting portion, on the first semiconductor element via an adhesive made of a thermosetting resin composition; bonding the second semiconductor element onto the first semiconductor element by using the adhesive while filling the adhesive in a hollow portion between the projecting portion of the second semiconductor element and the circuit base; and electrically connecting the connection parts of the circuit base and the second electrode pads via second metal wires, wherein a viscosity ($\mu_{0.5\ rpm}$) of the adhesive measured with an E-type viscometer at 0.5 rpm is in a range from 10 Pa·s to 150 Pa·s, a thixotropic ratio of the adhesive expressed by a ratio ($\mu_{0.5\ rpm}/\mu_{5\ rpm}$) of the viscosity ($\mu_{0.5\ rpm}$) of the adhesive at 0.5 rpm to a viscosity ($\mu_{5\ rpm}$) of the adhesive measured with the E-type viscometer at 5 rpm is 2 or more, and a gelation time of the adhesive expressed by a time to reach 2000 Pa·s with a viscosity measured with a dynamic viscoelastic measuring apparatus at 150° C. and revolutions of 1 Hz is 240 seconds or less.

DETAILED DESCRIPTION OF THE INVENTION

Figure 1:
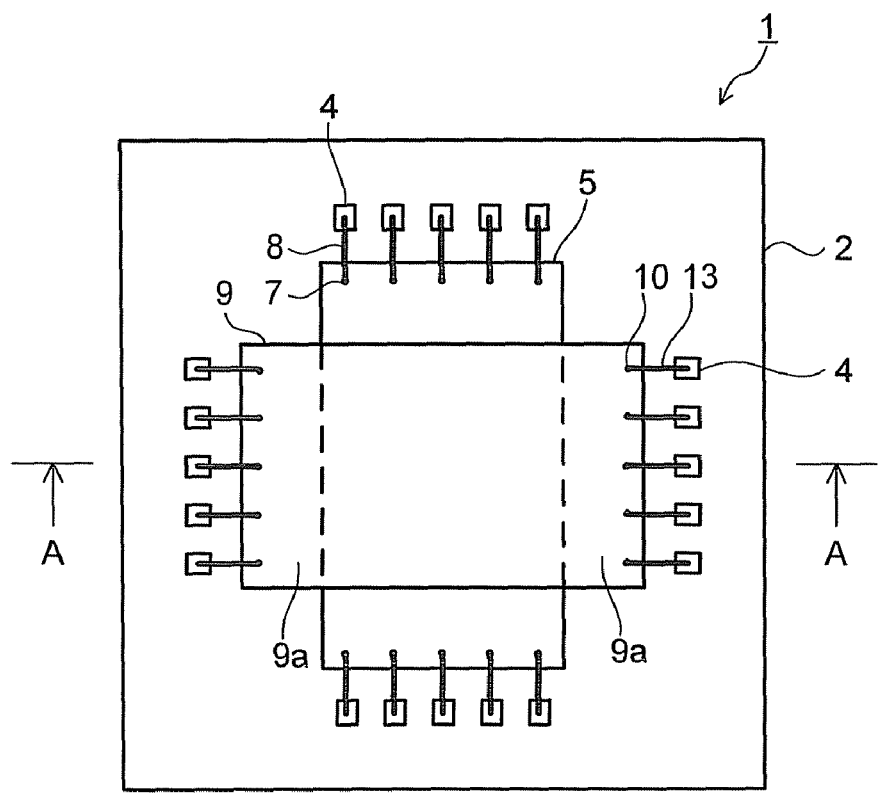
FIG. 1 is a plane view of a stacked semiconductor device according to an embodiment of the present invention.

Hereinafter, an embodiment of the present invention will be described with reference to the drawings. FIG. 1 is a plane view showing the structure of a stacked semiconductor device with a stacked multichip structure (stacked multichip package) according to an embodiment of the present invention, and FIG. 2 is a cross-sectional view thereof taken along the A-A line.

Figure 2:
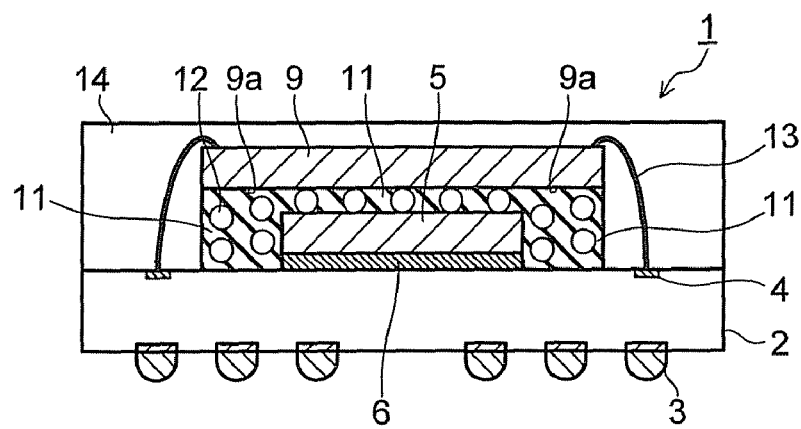
FIG. 2 is a cross-sectional view of the stacked semiconductor device taken along the A-A line in FIG. 1.

The stacked semiconductor device 1 shown in FIG. 1 and FIG. 2 includes a circuit base 2 for element mounting. The circuit base 2 for element mounting may be provided that it can have semiconductor elements mounted thereon and has a circuit. As such a circuit base 2, usable is a wiring board in which a wiring network is formed on a surface or in an inner part of an insulating substrate, a semiconductor substrate, or the like, or a base such as a lead frame in which an element mounting part and a circuit part are integrated.

The stacked semiconductor device 1 shown in FIG. 1 includes the wiring board 2 as the circuit base for element mounting. As a substrate forming the wiring board 2, any of substrates made of various kinds of materials such as an insulating substrate, for example, a resin substrate, a ceramics substrate, a glass substrate, or the like, or a semiconductor substrate is usable. An example of the wiring board using the resin substrate is a common multilayer copper-clad laminate (multilayer printed circuit board). On a lower surface side of the wiring board 2, external connection terminals 3 such as solder bumps are provided.

On an upper surface to be an element mounting surface of the wiring board 2, connection pads 4 electrically connected to the external connection terminals 3 via a wiring network (not shown) are provided. The connection pads 4 become connection parts at the time of wire bonding. A first semiconductor element 5 is bonded to an element mounting surface (upper surface) of the wiring board 2 via a first adhesive layer 6. As the first adhesive layer 6, a common die attach material (die attach film or the like) is used.

The first semiconductor element 5 has electrode pads (first electrode pads) 7 arranged along both short sides thereof. The electrode pads 7 provided on an upper surface of the first semiconductor element 5 are electrically connected to the connection pads 4 of the wiring board 2 via first metal wires (bonding wires) 8. As the first metal wires 8, conductive wires such as Au wires, Cu wires, or the like are used. This is also the same with later-described second metal wires.

On the first semiconductor element 5, a second semiconductor element 9 is stacked. The second semiconductor element 9 has electrode pads 10 arranged along both short sides thereof. The second semiconductor element 9 is disposed in an offset manner relative to the first semiconductor element 5. Concretely, the pad arrangement sides (short sides) of the first semiconductor element 5 and the pad arrangement sides (short sides) of the second semiconductor element 9 are orthogonal to each other, and both end portions (formation regions of the electrode pads 10) 9a as wire-bonded parts of the second semiconductor element 9 project to outer sides of an outer periphery of the first semiconductor element 5. Areas between the projecting portions 9a of the second semiconductor element 9 and the wiring board 2 are hollow.

The second semiconductor element 9 is bonded onto the first semiconductor element 5 via a second adhesive layer 11. Therefore, the second adhesive layer 11 is interposed between the first semiconductor element 5 and the second semiconductor element 9 (in a gap between the elements). Further, the second adhesive layer 11 is filled in the hollow portions between the projecting portions 9a of the second semiconductor element 9 and the wiring board 2, so that the projecting portions 9a are supported by the second adhesive layer 11. That is, the second adhesive layer 11 filled between the projecting portions 9a of the second semiconductor element 9 and the wiring board 2 functions as a support.

The gap between the first semiconductor element 5 and the second semiconductor element 9 in which the second adhesive layer 11 is interposed (inter-element gap) preferably is 15 μm or less in view of reducing a thickness of a stack of the semiconductor elements 5, 9, and as a result, reducing a thickness of the stacked semiconductor device 1 (package thickness). In other words, according to this embodiment, it is possible to fabricate the non-defective stacked semiconductor device 1 in which the inter-element gap determined by the thickness of the second adhesive layer 11 is 15 μm or less. A lower limit value of the inter-element gap is not necessarily limited but is preferably 1 μm or more in consideration of uniformity and so on of the second adhesive layer 11.

The second adhesive layer 11 is formed by a cured layer of an adhesive made of, for example, a thermosetting resin composition or a photo-setting resin composition having an insulating property. Examples of the thermosetting resin composition used as the adhesive are an epoxy resin composition, a polyimide resin composition, and the like. As will be described in detail later, the adhesive used in this embodiment has viscosity properties that a viscosity measured with an E-type viscometer at 0.5 rpm ($\mu_{0.5\ rpm}$) is within a range from 10 Pa·s to 150 Pa·s, and a thixotropic ratio expressed by a ratio ($\mu_{0.5\ rpm}/\mu_{5\ rpm}$) of the viscosity at 0.5 rpm ($\mu_{0.5\ rpm}$) to a viscosity measured with the E-type viscometer at 5 rpm ($\mu_{5\ rpm}$) is 2 or higher.

Further, the second adhesive layer 11 contains an insulating filler 12 functioning as spacer particles keeping the distance (inter-element gap) between the first and second semiconductor elements 5, 9. The insulating filler 12 is made of insulating resin having heat resistance (shape maintaining performance) against the temperature for bonding the second semiconductor element 9, and in the second adhesive layer 11, the insulating filler 12 functions as the spacer particles keeping the inter-element gap. A constituent material of the insulating filler 12 is not specifically limited, but thermosetting resin such as silicone resin, urethane resin, or polyimide resin is used, for instance.

The electrode pads (second electrode pads) 10 of the second semiconductor element 9 are electrically connected to the connection pads 4 of the wiring board 2 via second metal wires 13. The electrode pads 10 are disposed on the projecting portions 9a of the second semiconductor element 9. Performing the wire bonding in this state might cause bending or the like of the semiconductor element 9. In this embodiment, since the second adhesive layer 11 is filled in the hollow portions between the projecting portions 9a of the second semiconductor element 9 and the wiring board 2, the second metal wires 13 can be connected in good condition. Further, it is possible to prevent a crack or the like of the second semiconductor element 9 at the time of the bonding.

On the upper surface of the wiring board 2, a sealing resin layer 14 made of, for example, epoxy resin is formed by molding. The first and second semiconductor elements 5, 9 together with the metal wires 8, 13 and so on are integrally sealed by the sealing resin layer 14. They constitute the stacked semiconductor device 1 having the stacked multichip package structure. The stacked semiconductor device 1 of this embodiment is suitable as a semiconductor memory device whose capacity is increased by stacking semiconductor memory elements and the like in multi-tiers, but the application of the stacked semiconductor device 1 is not limited to such a semiconductor memory device. Incidentally, though the structure in which the two semiconductor elements 5, 9 are stacked is described with reference to FIG. 1 and FIG. 2, it goes without saying that the number of the stacked semiconductor elements is not limited to this and may be 3 or more.

Figure 3:
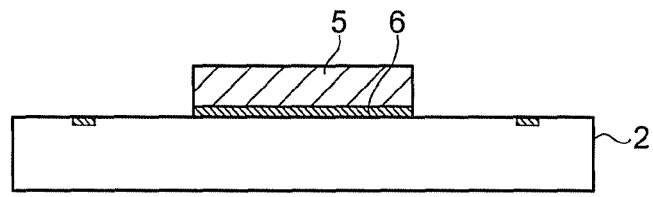
FIG. 3 is a view showing a step of bonding a first semiconductor element in manufacturing processes of the stacked semiconductor device shown in FIG. 1.

The stacked semiconductor device 1 of this embodiment is fabricated in the following manner, for instance. Manufacturing processes of the stacked semiconductor device 1 will be described with reference to FIG. 3 to FIG. 6. First, as shown in FIG. 3, the first semiconductor element 5 is bonded onto the wiring board 2 via the fist adhesive layer 6. Subsequently, the first semiconductor element 5 is subjected to a wire bonding process. The connection pads 4 of the wiring board 2 and the electrode pads 7 of the first semiconductor elements 5 are electrically connected via the first metal wires 8, though not shown in FIG. 3 (see FIG. 1).

Figure 4:
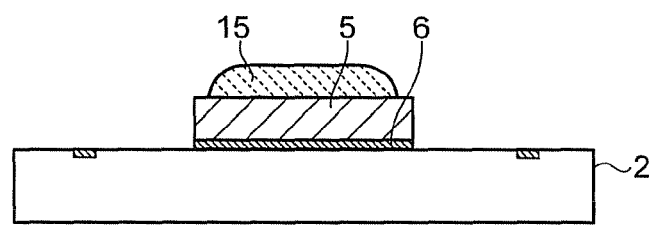
FIG. 4 is a view showing a step of supplying an adhesive onto the first semiconductor element in the manufacturing processes of the stacked semiconductor device shown in FIG. 1.
Figure 5:
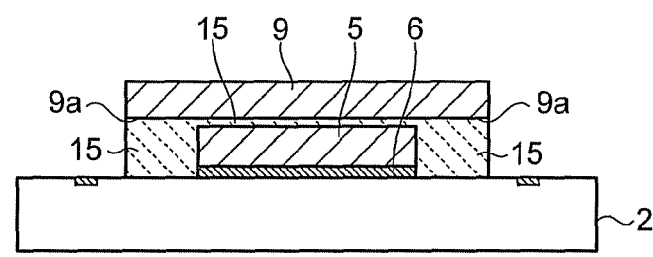
FIG. 5 is a view showing a step of applying a pressure to a second semiconductor element in the manufacturing processes of the stacked semiconductor device shown in FIG. 1.

Next, as shown in FIG. 4, an adhesive 15 for bonding the second semiconductor element 9 is supplied onto the first semiconductor element 5 with a dispenser or the like. A supply amount of the adhesive 15 is set in consideration of an amount filling the gap between the first semiconductor element 5 and the second semiconductor element 9 and an amount filling the hollow portions between the projecting portions 9a of the second semiconductor element 9 and the wiring board 2. Subsequently, as shown in FIG. 5, a pressure is applied to the second semiconductor element 9 mounted on the first semiconductor element 5, and while the adhesive 15 is filled in the hollow portions between the projecting portions 9a of the second semiconductor element 9 and the wiring board 2, the adhesive 15 between the first semiconductor element 5 and the second semiconductor element 9 is stretched out so that its thickness becomes small.

The adhesive 15 for the second semiconductor element 9 is made of a thermosetting resin composition or a photo-setting resin composition, and contains the insulating filler 12 (not shown in FIG. 3 to FIG. 6) functioning as the spacer particles. A particle size of the spacer particles is appropriately adjusted according to the gap between the first semiconductor element 5 and the second semiconductor element 9. The adhesive 15 is made of a liquid adhesive resin composition whose viscosity measured with the E-type viscometer at 0.5 rpm (viscosity $\mu_{0.5\ rpm}$ at a low-rotation speed) falls within a range from 10 Pa·s to 150 Pa·s. For example, RE550H by TOKI SANGYO Co., Ltd is used as the E-type viscometer.

The use of the adhesive 15 having the viscosity $\mu_{0.5\ rpm}$ at the low-rotation speed makes it possible to fully reduce the thickness of the adhesive 15 interposed between the first semiconductor element 5 and the second semiconductor element 9. Therefore, the gap between the first semiconductor element 5 and the second semiconductor element 9 (inter-element gap) determined by the thickness of the adhesive 15 can be kept narrow. Further, the use of the adhesive 15 containing the spacer particles makes it possible to favorably maintain the set inter-element gap. However, even when an adhesive not containing the spacer particles is used, the aforesaid viscosity $\mu_{0.5\ rpm}$ at the low-rotation speed favorably works and is effective for reducing the thickness of the adhesive 15.

Figure 7:
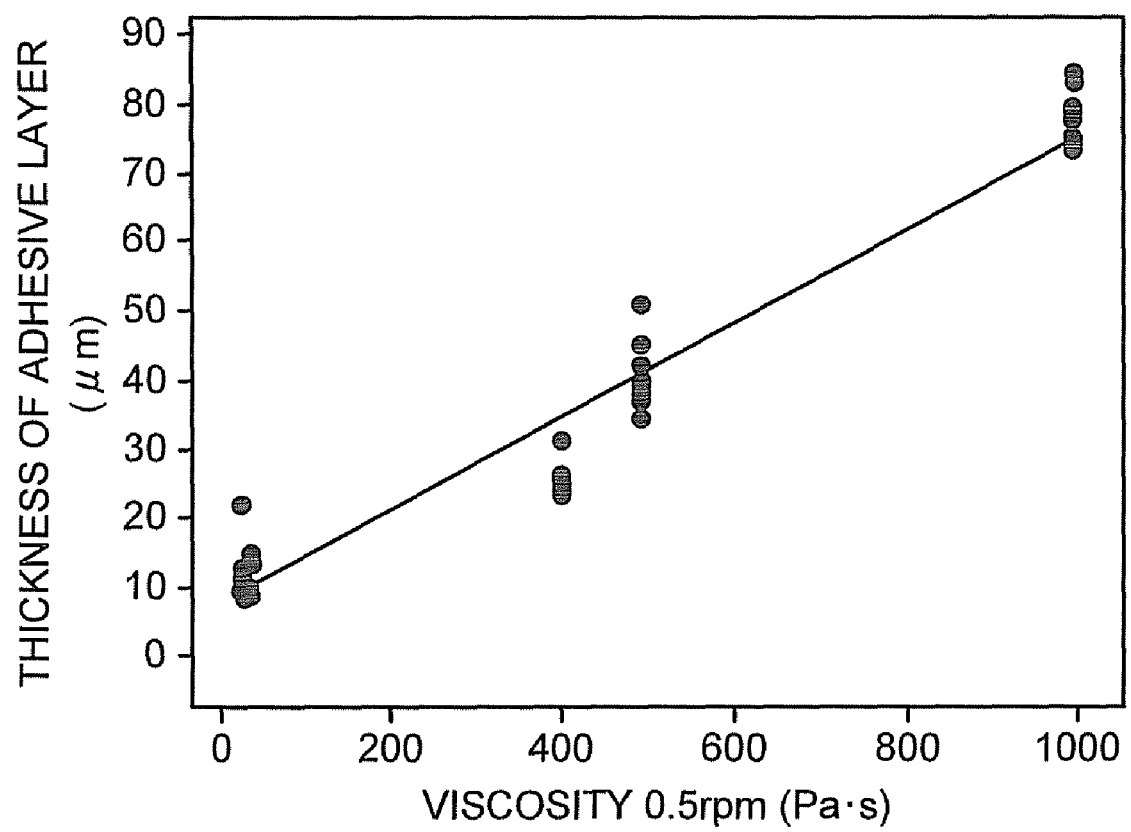
FIG. 7 is a chart showing an example of a correlation between viscosity ($\mu_{0.5\,rpm}$) of the adhesive at a low-rotation speed and thickness of the adhesive.

FIG. 7 shows a correlation between the viscosity $\mu_{0.5\ rpm}$ of the adhesive 15 at the low-rotation speed and the thickness of the adhesive 15 (the thickness of the adhesive 15 present in the gap between the first semiconductor element 5 and the second semiconductor element 9). The result shown in FIG. 7 is obtained when a liquid resin composition (liquid epoxy resin composition) is used as the adhesive 15 and the second semiconductor element 9 is pressed toward the first semiconductor element 5 with a 25 N load. As is apparent from FIG. 7, by setting the viscosity $\mu_{0.5\ rpm}$ of the adhesive 15 at the low-rotation speed to 150 Pa·s or lower, it is possible to fully reduce the thickness of the adhesive 15 (for example, to 15 μm or less).

When the viscosity $\mu_{0.5\ rpm}$ of the adhesive 15 at the low-rotation speed is too low, filling performance of the adhesive 15 in the hollow portions between the projecting portions 9a of the second semiconductor element 9 and the wiring board 2 and the like deteriorate, and therefore, the viscosity $\mu_{0.5\ rpm}$ of the adhesive 15 at the low-rotation speed is set to 10 Pa·s or higher. Because of these reasons, in this embodiment, the adhesive 15 whose viscosity $\mu_{0.5\ rpm}$ at the low-rotation speed falls within the range from 10 Pa·s to 150 Pa·s is used. The viscosity $\mu_{0.5\ rpm}$ of the adhesive 15 at the low-rotation speed can be adjusted based on the composition of the liquid resin (an amount of filler or solvent) or the like. The viscosity $\mu_{0.5\ rpm}$ of the adhesive 15 for the second semiconductor element 9 at the low-rotation speed more preferably falls within a range from 15 Pa·s to 100 Pa·s.

Incidentally, when the adhesive 15 made of the liquid adhesive resin composition is thinned by the pressure applied to the second semiconductor element 9, chip shift which is the rotation or movement of the second semiconductor element 9 may possibly occur if only the viscosity $\mu_{0.5\ rpm}$ of the adhesive 15 at the low-rotation speed is set low. That is, since the adhesive 15 has not been cured yet at the stage where the pressure is applied to the second semiconductor element 9, the second semiconductor element 9 may possibly rotate or move due to the low-viscosity property of the adhesive 15. This may cause a stacking failure or a positional failure of the second semiconductor element 9.

Therefore, this embodiment uses the adhesive 15 whose viscosity $\mu_{0.5\ rpm}$ at the low-rotation speed falls within the range from 10 Pa·s to 150 Pa·s, and in addition, whose thixotropic ratio expressed by the ratio ($\mu_{0.5\ rpm}/\mu_{5\ rpm}$) of the viscosity at 0.5 rpm (viscosity $\mu_{0.5\ rpm}$ at the low-rotation speed) to the viscosity measured with the E-type viscometer at 5 rpm (viscosity $\mu_{5\ rpm}$ at the high-rotation speed) is 2 or higher. The thixotropic ratio ($\mu_{0.5\ rpm}/\mu_{5\ rpm}$) is based on JIS K7117-2 "Liquid, Emulsion-like or Dispersed Resin—Viscosity Measuring Method (Room-temperature Measurement) by a Rotational Viscometer at a Fixed Shearing Speed)".

The thixotropic ratio of the adhesive (the thermosetting resin composition or the photo-setting resin composition) 15 can be adjusted by, for example, adding a thixotropic material to the liquid resin composition, which becomes a major component of the adhesive, to vary the viscosity $\mu_{0.5\ rpm}$ at the low-rotation speed based on the viscosity $\mu_{5\ rpm}$ at the high-rotation speed. At this time, the thixotropic ratio of the adhesive 15 is adjusted so that the viscosity $\mu_{0.5\ rpm}$ at the low-rotation speed is kept within the range from 10 Pa·s to 150 Pa·s. An upper limit of the thixotropic ratio is not specifically limited, and the thixotropic ratio only needs to be a value with which the viscosity $\mu_{0.5\ rpm}$ at the low-rotation speed can be kept within the range from 10 Pa·s to 150 Pa·s. The thixotropic material is added when necessary. When the thixotropic ratio of the liquid resin composition is 2 or higher, it is possible to use the liquid resin composition as the adhesive as it is without adding the thixotropic material.

When the thermosetting resin composition is used as the adhesive 15, the thermosetting liquid resin composition generally contains thermosetting resin and a curing agent as major agents. Epoxy resin, polyimide resin, or the like is used as the thermosetting resin. The curing agent is appropriately selected according to the thermosetting resin, and acid anhydride, phenol, amine, a phosphorus-based curing agent, or the like is used, for instance. When necessary, the liquid resin composition may contain a curing accelerator such as imidazole, an inorganic filler such as silica, alumina, quartz powder, or titanium oxide, a colorant, a coupling agent, a solvent, and the like.

When the adhesive 15 is made of the thermosetting resin composition, the thixotropic material is used as a material determining the properties during or after the application (properties as a liquid or viscous substance before curing, in addition to the materials, such as the thermosetting resin, the curing agent, the curing accelerator, the inorganic filler, and the like, determining properties after the curing. As the thixotropic material, used is calcium carbonate, fumed silica, organic mica, talc, ceramics powder, or the like. Adding the thixotropic material to the liquid resin composition makes it possible to increase the thixotropic ratio of the adhesive (thermosetting resin composition) as well as to keep the viscosity $\mu_{0.5\ rpm}$ at the low-rotation speed low. This is also the same with the case where the adhesive is made of the photo-setting resin composition.

Increasing an amount of the thixotropic material added to the liquid resin composition tends to increase the thixotropic ratio of the adhesive. Preferably, a content ratio of the added thixotropic material to the liquid resin composition is 1 mass % or lower. When the addition amount of the thixotropic material is over 1 mass %, the thixotropic ratio becomes too high and the viscosity $\mu_{0.5\ rpm}$ at the low-rotation speed is likely to be high. When the thixotropic ratio of the liquid resin composition is 2 or higher, the thixotropic material need not be added. The thixotropic material is added when necessary, and the addition amount of the thixotropic material includes zero.

Table 1 shows concrete examples of the adhesives 15 which are made of the thermosetting resin compositions (epoxy resin compositions A to C) and their viscosity properties. The resin composition A and the resin composition B are each made only of a liquid resin composition (a liquid mixture containing epoxy resin, a curing agent, and a filler) and not contain the thixotropic material. The resin composition C is made of a mixture of a liquid resin composition and the thixotropic material. As shown in Table 1, when the thixotropic ratio of the liquid resin composition is 2 or higher, the thixotropic material need not be added. When the thixotropic ratio of the liquid resin composition is less than 2, the addition of the thixotropic material is effective. In Table 1, the curing agent is liquid acid anhydride, the filler is silica, and the thixotropic material is hydrophilic fumed silica.

TABLE 1

| | composition (mass %) | | | | viscosity properties | | |
|---|---|---|---|---|---|---|---|
| | epoxy resin | curing agent | filler | thixotropic material | $\mu_{0.5\ rpm}$ | $\mu_{5\ rpm}$ | thixotropic ratio ($\mu_{0.5\ rpm}/\mu_{5\ rpm}$) |
| resin compo. A | 40 | 50 | 10 | 0 | 29 | 6 | 4.80 |
| resin compo. B | 50 | 40 | 10 | 0 | 66 | 22 | 3.00 |
| resin compo. C | 50 | 40 | 9.85 | 0.15 | 104 | 22 | 4.73 |

When the addition amount of the thixotropic material is increased, the thixotropic material is likely to condense even though the thixotropic ratio of the adhesive can be increased. In such a case, it is preferable to use a thixotropic material having undergone surface treatment such as fluorine coating. The liquid resin composition and the thixotropic material are mixed by using a mixer such as a three-roll mixer. This is also the same with the fabrication of the liquid resin composition. The adhesive prepared by mixing the liquid resin composition and the thixotropic material by the three-roll mixer is vacuum-deaerated and filled in a vessel and thereafter supplied onto the first semiconductor element 5.

Figure 8:
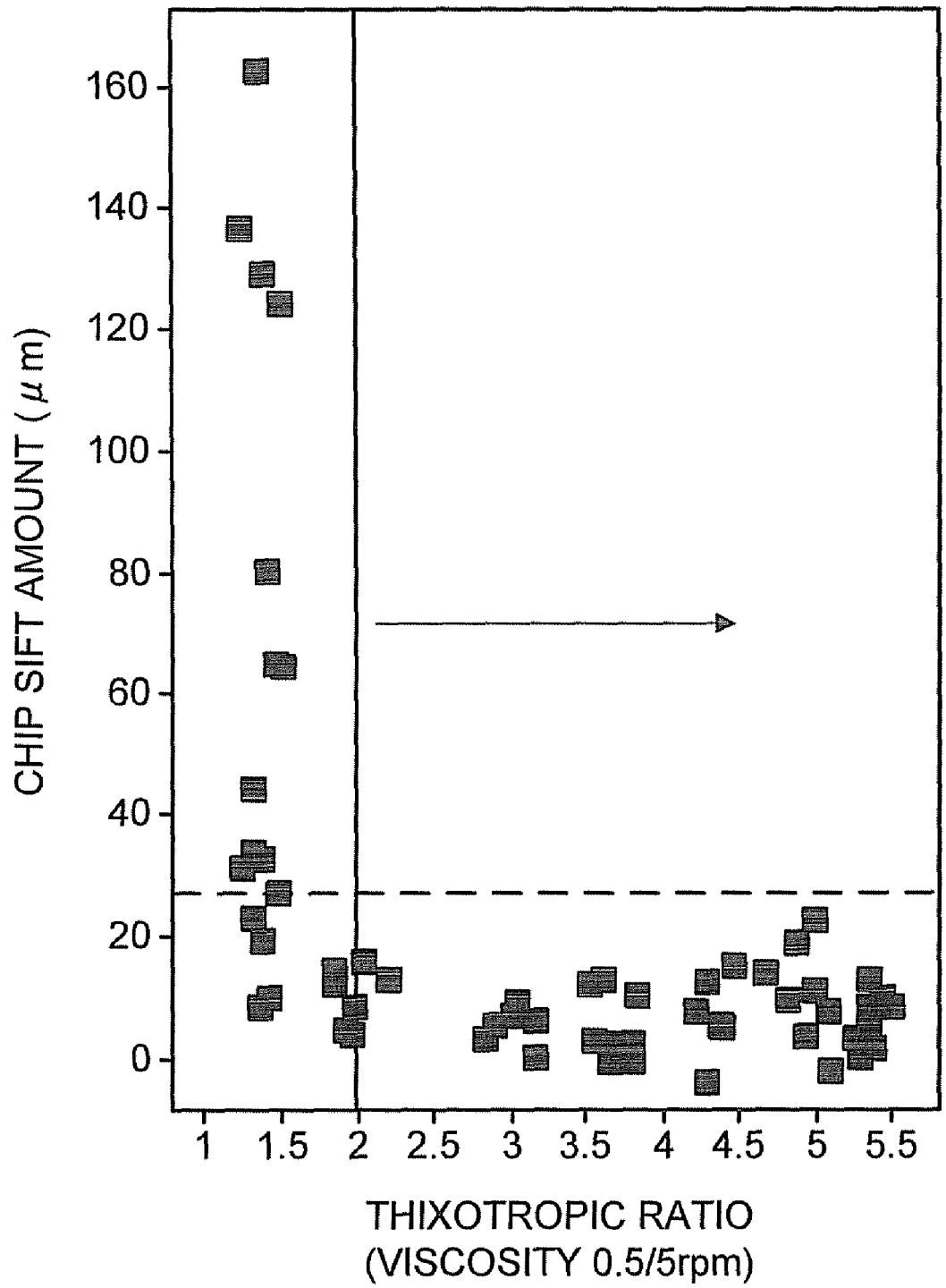
FIG. 8 is a chart showing an example of a correlation between a thixotropic ratio of the adhesive and a chip shift amount.

FIG. 8 shows a correlation between the thixotropic ratio ($\mu_{0.5\ rpm}/\mu_{5\ rpm}$) of the adhesive 15 and the chip shift amount of the second semiconductor element 9 (here, a positional displacement amount of the center of the second semiconductor element 9). The result shown in FIG. 8 is obtained when a liquid resin composition (liquid epoxy resin composition) whose viscosity $\mu_{0.5\ rpm}$ at the low-rotation speed falls within the range from 10 Pa·s to 150 Pa·s is used as the adhesive 15 and the second semiconductor element 9 is pressed toward the first semiconductor element 5 with a 25 N load. As is apparent from FIG. 8, by setting the thixotropic ratio ($\mu_{0.5\ rpm}/\mu_{5\ rpm}$) of the adhesive 15 to 2 or higher, it is possible to reduce the chip shift amount of the second semiconductor element 9 (for example, to 25 μm or less).

As described above, the use of the adhesive 15 whose viscosity $\mu_{0.5\ rpm}$ at the low-rotation speed falls within the range from 10 Pa·s to 150 Pa·s and whose thixotropic ratio ($\mu_{0.5\ rpm}/\mu_{5\ rpm}$) is 2 or higher makes it possible to prevent the chip shift of the second semiconductor element 9 as well as to fully reduce the thickness of the adhesive 15. Therefore, it is possible to realize both the non-defective stacking of the first semiconductor element 5 and the second semiconductor element 9 and the reduction in the thickness of the stack of the first semiconductor element 5 and the second semiconductor element 9, resulting in a reduction in the thickness of the stacked semiconductor device 1 (package thickness). That is, it is possible to improve reliability, manufacturing yields, and the like of the thinned stacked semiconductor device 1 with good reproducibility.

When the photo-setting resin composition is used as the adhesive 15, the chip shift of the second semiconductor element 9 at the time when the pressure is applied to the second semiconductor element 9 (when the adhesive 15 is stretched thin) is taken into consideration. When the thermosetting resin composition is used as the adhesive 15, it is preferable to take into consideration the chip shift due to viscosity decrease at the time when the adhesive 15 is cured, in addition to the chip shift at the time when the pressure is applied to the second semiconductor element 9. In view of this respect, it is preferable to use the adhesive 15 whose gelation time expressed by a time to reach 2000 Pa·s with a viscosity measured with a dynamic viscoelastic measuring apparatus at 150° C. and revolutions of 1 Hz is 240 seconds or less. For example, RSA-III by TA INSTRUMENTS is used as the dynamic viscoelastic measuring apparatus.

Figure 9:
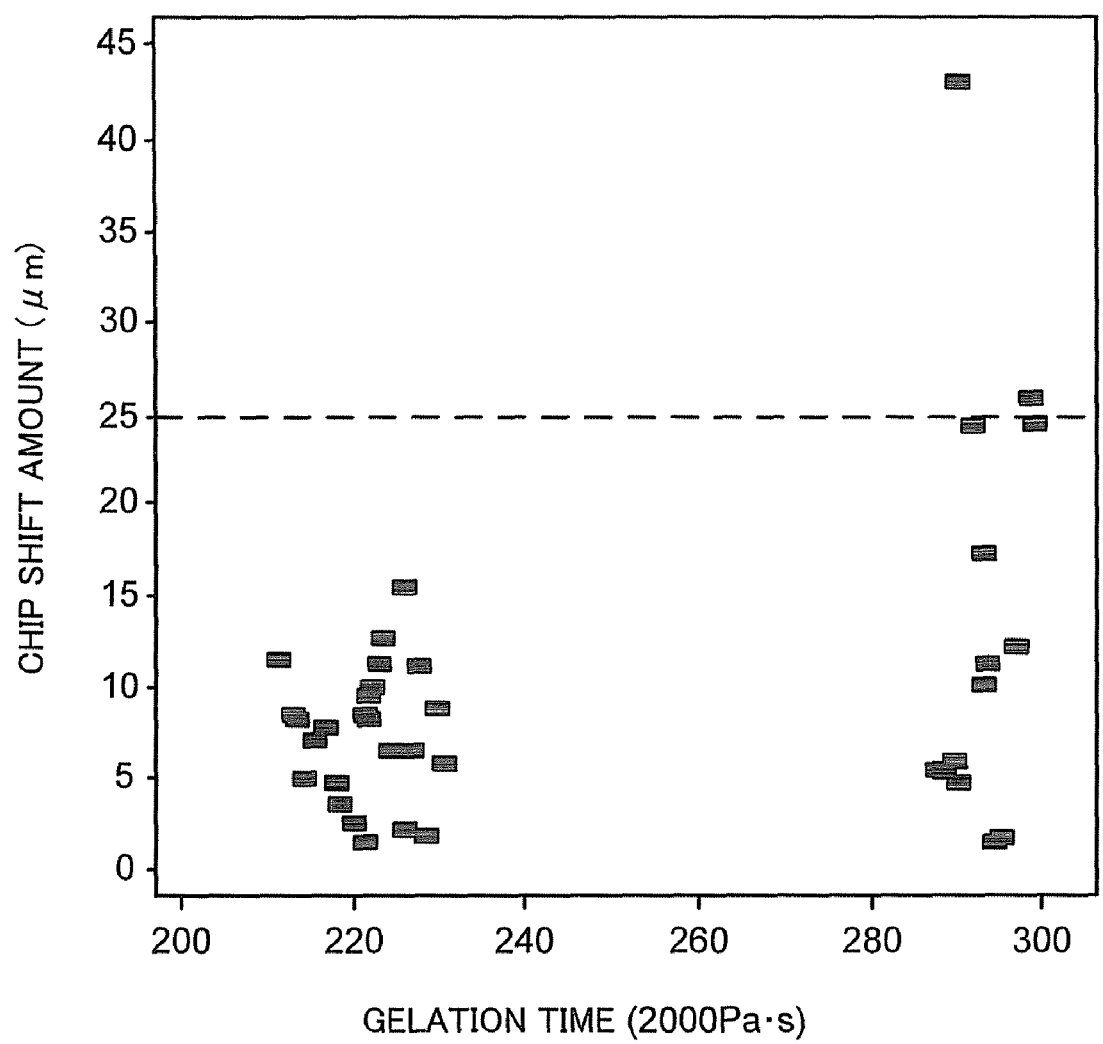
FIG. 9 is a chart showing an example of a correlation between the gelation time of the adhesive and the chip shift amount.

FIG. 9 shows a correlation between the gelation time of the adhesive 15 and the chip shift amount of the second semiconductor element 9 (here, the positional displacement amount of the center of the second semiconductor element 9). The result shown in FIG. 9 is obtained when a liquid epoxy resin composition whose viscosity $\mu_{0.5\ rpm}$ at the low-rotation speed falls within the range from 10 Pa·s to 150 Pa·s and whose thixotropic ratio ($\mu_{0.5\ rpm}/\mu_{5\ rpm}$) is 2 or higher is used as the adhesive 15 and the chip shift amount at the time of its curing is measured. As is apparent from FIG. 9, when the gelation time of the adhesive 15 is 240 seconds or less, it is possible to reduce the chip shift amount when the adhesive 15 is cured (for example, to 25 μm or less). The gelation time of the adhesive 15 is more preferably 225 seconds or less.

Figure 6:
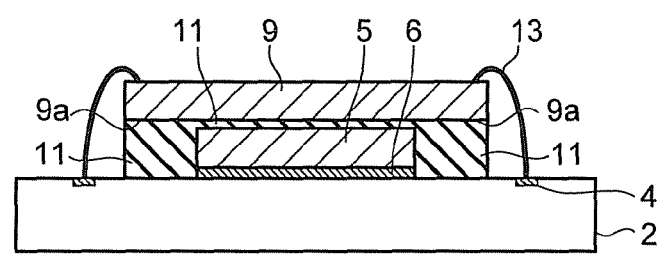
FIG. 6 is a view showing a step of bonding the second semiconductor element and a wire bonding step thereof in the manufacturing processes of the stacked semiconductor device shown in FIG. 1.

After the adhesive 15 having the above-described viscosity properties is stretched thin between the first semiconductor element 5 and the second semiconductor element 9 while being filled in the hollow portions between the projecting portions 9a of the second semiconductor element 9 and the wiring board 2, the adhesive 15 is cured by a curing process (heat treatment or light irradiation treatment) appropriate for the adhesive 15. By applying such curing process, the first semiconductor element 5 and the second semiconductor element 9 are stacked (bonded) via the second adhesive layer 11 and the projecting portions 9a of the second semiconductor element 9 is supported by the second adhesive layer 11 as shown in FIG. 6. Further, the wire bonding process is performed for the second semiconductor element 9 to electrically connect the connection pads 4 of the wiring board 2 and the electrode pads 10 of the second semiconductor element 9 via the second metal wires 13.

The process of bonding the second semiconductor element 9 and the wire bonding process thereof shown in FIG. 6 are followed by a process of forming the external connection terminals 3 on the lower surface of the wiring board 2. The external connection terminals 3 are formed in such a manner that solder balls are disposed on the lower surface of the wiring board 2 and thereafter are subjected to solder reflow. Therefore, the second adhesive layer 11 preferably has reflow resistance. In view of this respect, when properties of the second adhesive layer 11 (post-curing properties of the adhesive 15) are measured according to JIS K7244-4 (1999) "Plastics—Determination of Dynamic Mechanical Properties Part 4: Tensile Vibration—Non-resonance Method", it is preferable that storage modulus at 260° C. falls within a range from 1 MPa to 300 MPa and shear strength at 260° C. is 1 MPa or more.

Figure 10:
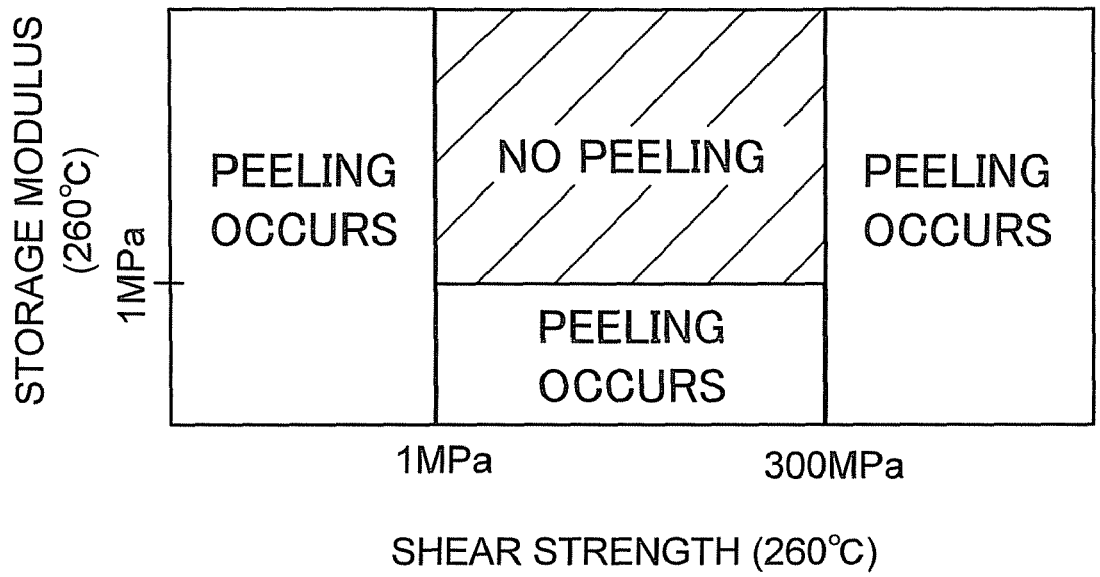
FIG. 10 is a chart showing a correlation of storage modulus and shear strength of an adhesive layer with the presence/absence of a peeling failure at the time of a reflow process.
Figure 11:
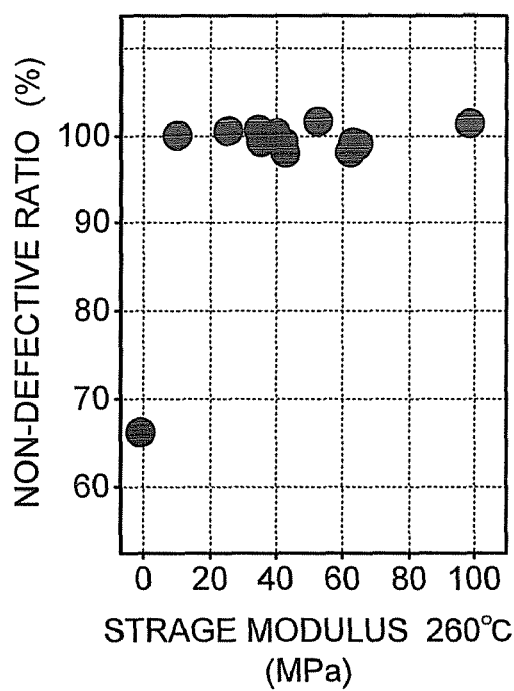
FIG. 11 is a chart showing a correlation between the storage modulus of the adhesive layer and a non-defective ratio at the time of the reflow process.
Figure 12:
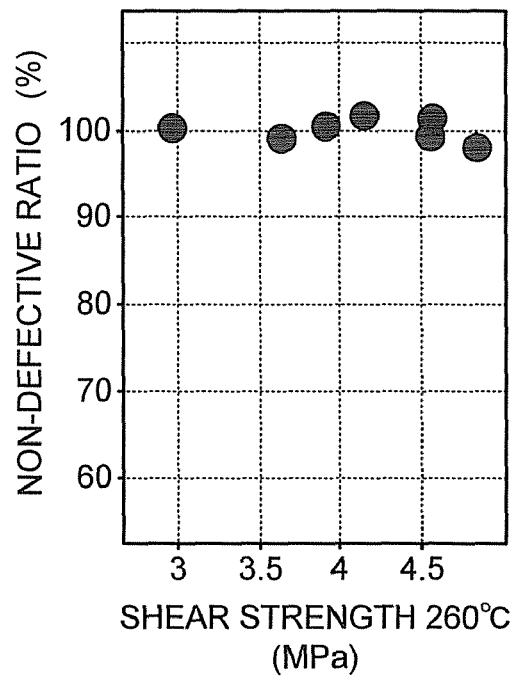
FIG. 12 is a chart showing a correlation between the shear strength of the adhesive layer and the non-defective ratio at the time of the reflow process.

FIG. 10 shows a correlation of storage modulus (260° C.) and shear strength (260° C.) of the adhesive layer 11 with a peeling failure at the time of the reflow process. FIG. 11 shows a correlation between the storage modulus (260° C.) of the adhesive layer 11 and the presence/absence of the peeling failure (non-defective ratio) at the time of the reflow process. FIG. 12 shows a correlation between the shear strength (260° C.) of the adhesive layer 11 and the presence/absence of the peeling failure (non-defective ratio) at the time of the reflow process. The results shown in FIG. 10 to FIG. 12 are obtained as a result of the evaluation on the presence/absence of the peeling of the adhesive layer 11 (non-defective ratio) when the reflow process is conducted without any resin sealing after the semiconductor element is mounted on the adhesive layer 11 and the adhesive layer 11 is cured.

Figure 13:
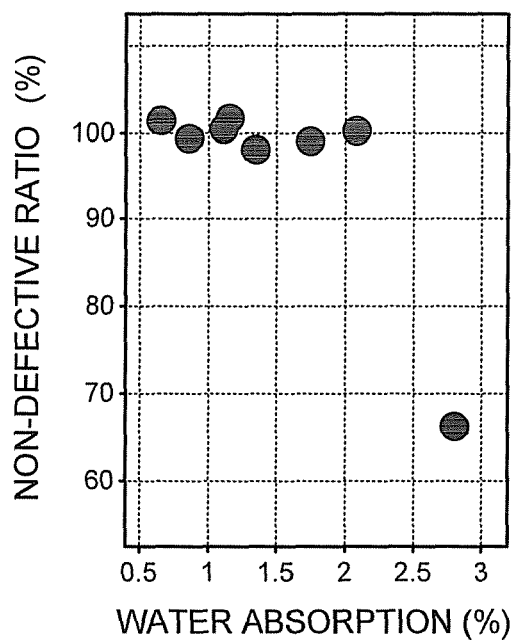
FIG. 13 is a chart showing a correlation between water adsorption of the adhesive layer and the non-defective ratio at the time of the reflow process.

As is apparent from FIG. 10 to FIG. 12, among the post-curing properties of the adhesive 15, when the storage modulus at 260° C. falls within the range from 1 MPa to 300 MPa and the shear strength at 260° C. is 1 MPa or more, it is possible to prevent the occurrence of the peeling failure of the adhesive layer 11 in the reflow process. Further, a mass change ratio (water adsorption) of the second adhesive layer 11 is preferably 2% or lower after it is left for 24 hours under an environment of an 85° C. temperature and an 85% humidity. This can further improve reflow resistance. FIG. 13 shows a correlation between the water absorption of the adhesive layer 11 and the presence/absence of the peeling failure (non-defective ratio) at the time of the reflow process.

According to the method of manufacturing the stacked semiconductor device 1 of this embodiment, based on the viscosity $\mu_{0.5\ rpm}$ at the low-rotation speed and the thixotropic ratio ($\mu_{0.5\ rpm}/\mu_{5\ rpm}$) of the adhesive 15 for the second semiconductor element 9 and further its gelation time, it is possible not only to realize the filling performance of the adhesive layer 11 in the hollow portions between the projecting portions 9a of the second semiconductor element 9 and the wiring board 2, the reduction in the gap between the first semiconductor element 5 and the second semiconductor element 9, and so on, but also to prevent the chip shift of the second semiconductor element 9. Therefore, it is possible to improve reliability and manufacturing yields of the thinned stacked semiconductor device 1 with good reproducibility.

Though the above embodiment describes the structure in which the two semiconductor elements 5, 9 are stacked, the number of the stacked semiconductor elements is not limited to this and may be 3 or more. The stacking structure of the semiconductor elements is not particularly limited either, and may be any stacking structure provided that part of the upper semiconductor element projects from (comes off the edge of) the outer periphery of the lower semiconductor element. The circuit base for element mounting in the stacked semiconductor device is not limited to the wiring board, and may be a lead frame or the like. FIG. 14 to FIG. 17 show modification examples of the stacked semiconductor device of the embodiment.

Figure 14:
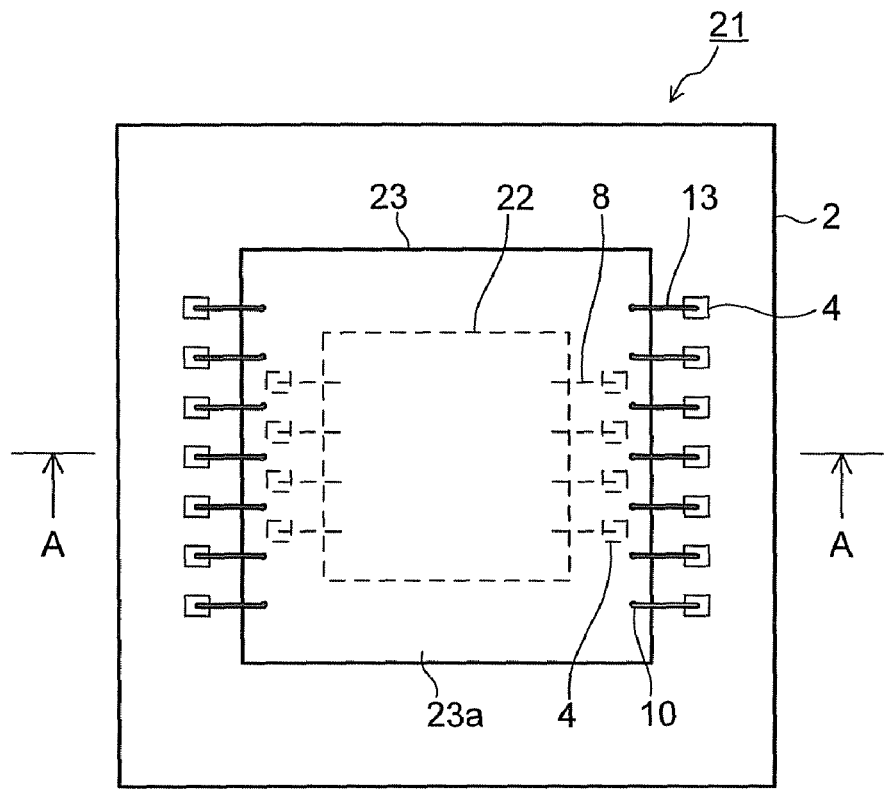
FIG. 14 is a plane view showing a first modification example of the stacked semiconductor device shown in FIG. 1.
Figure 15:
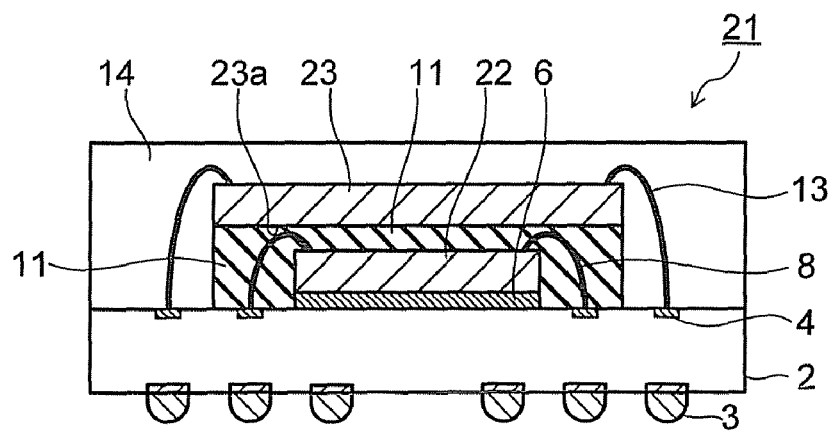
FIG. 15 is a cross-sectional view of the stacked semiconductor device taken along the A-A line in FIG. 14.

In a stacked semiconductor device 21 shown in FIG. 14 and FIG. 15, a second semiconductor element 23 is stacked on a first semiconductor element 22 via the second adhesive layer 11. The second semiconductor element 23 is larger in shape than the first semiconductor element 22. Therefore, an outer peripheral portion as a wire bonded part of the second semiconductor element 23 projects to an outer side of an outer periphery of the first semiconductor element 22. An area between such a projecting portion 23a and the wiring board 2 is hollow, and the second adhesive layer 11 is filled in such a portion.

First metal wires 8 connected to the first semiconductor element 22 are prevented from coming into contact with the second semiconductor element 23 since they are buried in the second adhesive layer 11. That is, the first metal wires 8 are apart from a lower surface of the second semiconductor element 23 due to the thickness of the second adhesive layer 11 (a gap between the first semiconductor element 22 and the second semiconductor element 23). This prevents the occurrence of an insulation failure and a short-circuit ascribable to the contact between the first metal wires 8 and the second semiconductor element 23. In such a stacking structure, it is generally preferable that a thickness of the second adhesive layer 11 between the elements falls within a range from 25 μm to 75 μm though depending on the wire diameter.

Figure 16:
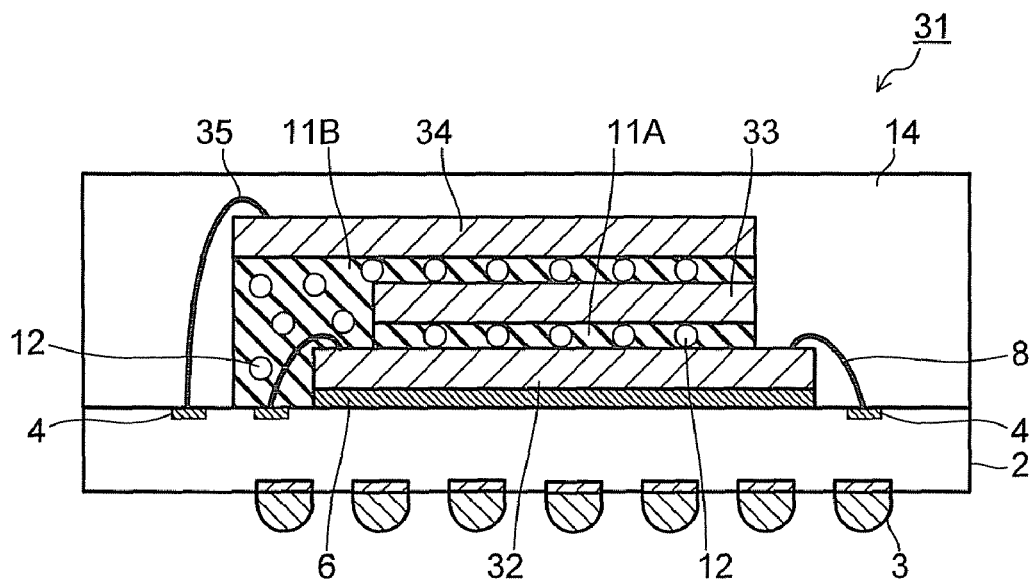
FIG. 16 is a cross-sectional view showing a second modification example of the stacked semiconductor device shown in FIG. 1.

In a stacked semiconductor device 31 shown in FIG. 16, a second semiconductor element 33 is stacked on a first semiconductor element 32 via a second adhesive layer 11A. The second semiconductor element 33 is disposed in an offset manner relative to the first semiconductor element 32 as in the previously described embodiment. Therefore, both end portions (not shown) as wire bonded parts of the second semiconductor element 33 project to outer sides of an outer periphery of the first semiconductor element 32. Areas between such projecting portions and the wiring board 2 are hollow, and the second adhesive layer 11A is filled in such portions.

A third semiconductor element 34 is stacked the second semiconductor element 33 via a third adhesive layer 11B. The third semiconductor element 34 has electrode pads (not shown) disposed along one short side thereof. The third semiconductor element 34 is disposed in an offset manner relative to the second semiconductor element 33 and is larger in shape than the first semiconductor element 32. An end portion as a wire bonded part of the third semiconductor element 34 projects to an outer side of outer peripheries of the first and second semiconductor elements 32, 33. An area between such a projecting portion 34a and the wiring board 2 is hollow and the third adhesive layer 11B is filled in such a portion.

The electrode pads (not shown) of the third semiconductor element 34 are electrically connected to the connection pads 4 of the wiring board 2 via third metal wires 35. The second and third adhesive layers 11A, 11B each are formed by a cured layer of an adhesive made of a thermosetting resin composition or a photo-setting resin composition containing the insulating filler 12 similarly to the adhesive layer 11 of the previously described embodiment. As in the previously described embodiment, the adhesive has viscosity properties that the viscosity measured with the E-type viscometer at 0.5 rpm ($\mu_{0.5\ rpm}$) falls within the range from 10 Pa·s to 150 Pa·s, and the thixotropic ratio expressed by the ratio ($\mu_{0.5\ rpm}/\mu_{5\ rpm}$) of the viscosity at 0.5 rpm ($\mu_{0.5\ rpm}$) to the viscosity measured with the E-type viscometer at 5 rpm ($\mu_{5\ rpm}$) is 2 or higher. The other properties are also the same.

Figure 17:
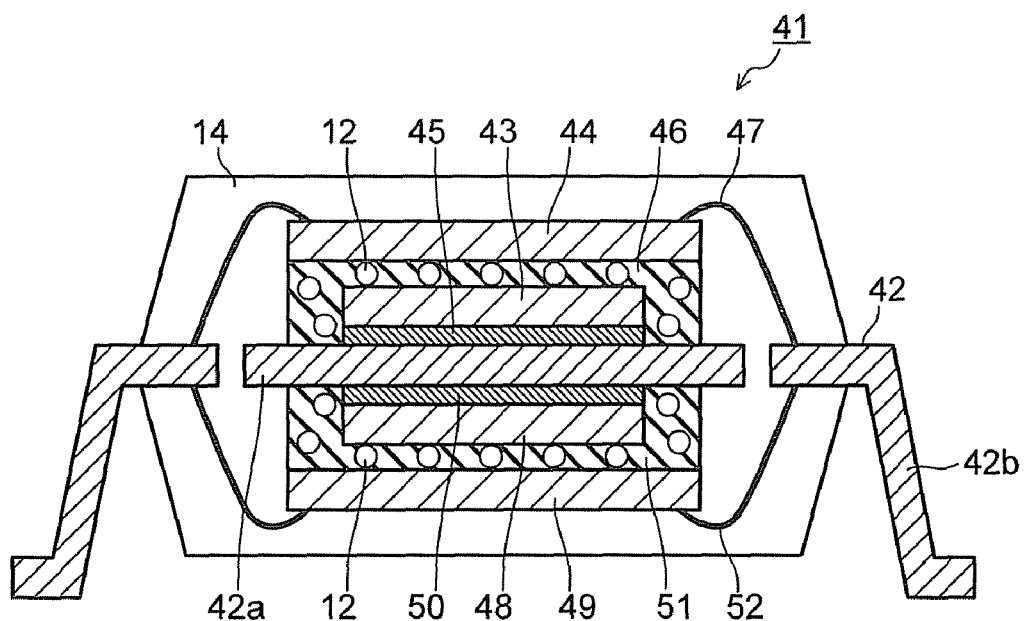
FIG. 17 is a cross-sectional view showing a third modification example of the stacked semiconductor device shown in FIG. 1.

A stacked semiconductor device 41 shown in FIG. 17 includes a lead frame 42 as a circuit base. On an upper surface of an element mounting part 42a of the lead frame 42, a first semiconductor element 43 and a second semiconductor element 44 are stacked. The first semiconductor element 43 is bonded to the element mounting part 42a via a first adhesive layer 45. Electrode pads (not shown) of the first semiconductor element 43 are electrically connected to lead parts 42b of the lead frame 42 via first metal wires (not shown). The second semiconductor element 44 is bonded onto the first semiconductor element 43 via a second adhesive layer 46. Electrode pads (not shown) of the second semiconductor element 44 are electrically connected to the lead parts 42b of the lead frame 42 via second metal wires 47.

On a lower surface of the element mounting part 42a of the lead frame 42, a third semiconductor element 48 and a fourth semiconductor element 49 are stacked. The third semiconductor element 48 is bonded to the element mounting part 42a via a third adhesive layer 50. Electrode pads (not shown) of the third semiconductor element 48 are electrically connected to the lead parts 42b of the lead frame 42 via third metal wires (not shown). The fourth semiconductor element 49 is bonded onto the third semiconductor element 48 via a fourth adhesive layer 51. Electrode pads (not shown) of the fourth semiconductor element 49 are electrically connected to the lead parts 42b via fourth metal wires 52.

The second and fourth semiconductor elements 44, 49 are disposed in an offset manner relative to the first and third semiconductor elements 43, 48 respectively. Therefore, both end portions as wire bonded parts of the second and fourth semiconductor elements 44, 49 project to outer sides of outer peripheries of the first and third semiconductor elements 43, 48. Areas between such projecting portions and the wiring board 2 are hollow and the second and fourth adhesive layers 46, 51 are filled in such portions.

Similarly to the adhesive layer 11 of the previously described embodiment, the second and fourth adhesive layers 46, 51 are each formed by a cured layer of an adhesive made of a thermosetting resin composition or a photo-setting rein composition containing the insulating filler 12. As in the previously described embodiment, the adhesive has viscosity properties that the viscosity measured with the E-type viscometer at 0.5 rpm ($\mu_{0.5\ rpm}$) falls within the range from 10 Pa·s to 150 Pa·s, and the thixotropic ratio expressed by the ratio ($\mu_{0.5\ rpm}/\mu_{5\ rpm}$) of the viscosity at 0.5 rpm ($\mu_{0.5\ rpm}$) to the viscosity measured with the E-type viscometer at 5 rpm ($\mu_{5\ rpm}$) is 2 or higher. The adhesive having such viscosity properties is also effective to the stacked semiconductor device 41 using the lead frame 42 and can realize both the reduction in the inter-element gap and the prevention of chip shift.

It should be noted that the present invention is not limited to the embodiment described above and is also applicable to the manufacture of various kinds of stacked semiconductor devices in which a plurality of semiconductor elements are bonded by an adhesive layer and part of an upper semiconductor element is disposed to project to an outer side of an outer periphery of a lower semiconductor element. Methods of manufacturing such stacked semiconductor devices are also included in the present invention. Further, the embodiment of the present invention may be expanded or modified within the range of the technical idea of the present invention, and the expanded and modified embodiments are also included in the technical scope of the present invention.

What is claimed is:

1. A method of manufacturing a stacked semiconductor device, comprising:
   bonding a first semiconductor element having first electrode pads onto a circuit base having connection parts;
   electrically connecting the connection parts of the circuit base and the first electrode pads via first metal wires;

disposing a second semiconductor element having a portion projecting to an outer side of an outer periphery of the first semiconductor element and second electrode pads provided on at least the projecting portion, on the first semiconductor element via an adhesive;

bonding the second semiconductor element onto the first semiconductor element by using the adhesive while filling the adhesive in a hollow portion between the projecting portion of the second semiconductor element and the circuit base; and electrically connecting the connection parts of the circuit base and the second electrode pads via second metal wires, wherein a viscosity ($\mu_{0.5\ rpm}$) of the adhesive measured with an E-type viscometer at 0.5 rpm is in a range from 10 Pa·s to 150 Pa·s, and a thixotropic ratio of the adhesive expressed by a ratio ($\mu_{0.5\ rpm}/\mu_{5\ rpm}$) of the viscosity ($\mu_{0.5\ rpm}$) of the adhesive at 0.5 rpm to a viscosity ($\mu_{5\ rpm}$) of the adhesive measured with the E-type viscometer at 5 rpm is 2 or more.

2. The method of manufacturing the stacked semiconductor device according to claim 1, wherein the adhesive contains spacer particles.

3. The method of manufacturing the stacked semiconductor device according to claim 2, wherein the spacer particles are insulating resin particles whose shape is maintained at a temperature for bonding the second semiconductor element.

4. The method of manufacturing the stacked semiconductor device according to claim 1, wherein the second semiconductor element is stacked on the first semiconductor element via a cured layer of the adhesive, with a gap of 15 µm or less being interposed between the first semiconductor element and the second semiconductor element.

5. The method of manufacturing the stacked semiconductor device according to claim 1, wherein the adhesive is made of a thermosetting resin composition or a photo-setting resin composition.

6. The method of manufacturing the stacked semiconductor device according to claim 5, wherein the thermosetting resin composition or the photo-setting resin composition contains a liquid resin composition and a thixotropic material whose content ratio to the liquid resin composition is 1 mass % or less (including zero).

7. The method of manufacturing the stacked semiconductor device according to claim 1, wherein the circuit base includes a wiring board or a lead frame.

8. The method of manufacturing the stacked semiconductor device according to claim 7, further comprising, forming external connection terminals made of solder balls on a surface, of the wiring board as the circuit base, opposite a surface having the connection parts.

9. The method of manufacturing the stacked semiconductor device according to claim 8, wherein when post-curing properties of the adhesive are measured according to JIS K7244-4 (1999) "Plastics—Determination of Dynamic Mechanical Properties Part 4: Tensile Vibration—Non-resonance Method", a storage modulus at 260° C. is in a range from 1 MPa to 300 MPa and a shear strength at 260° C. is 1 MPa or more.

10. The method of manufacturing the stacked semiconductor device according to claim 8, wherein a mass change ratio of the adhesive is 2% or less after the adhesive is left for 24 hours under an environment of an 85° C. temperature and an 85% humidity after being cured.

11. A method of manufacturing a stacked semiconductor device, comprising:

bonding a first semiconductor element having first electrode pads onto a circuit base having connection parts;

electrically connecting the connection parts of the circuit base and the first electrode pads via first metal wires;

disposing a second semiconductor element having a portion projecting to an outer side of an outer periphery of the first semiconductor element and second electrode pads provided on at least the projecting portion, on the first semiconductor element via an adhesive made of a thermosetting resin composition;

bonding the second semiconductor element onto the first semiconductor element by using the adhesive while filling the adhesive in a hollow portion between the projecting portion of the second semiconductor element and the circuit base; and electrically connecting the connection parts of the circuit base and the second electrode pads via second metal wires, wherein a viscosity ($\mu_{0.5\ rpm}$) of the adhesive measured with an E-type viscometer at 0.5 rpm is in a range from 10 Pa·s to 150 Pa·s, a thixotropic ratio of the adhesive expressed by a ratio ($\mu_{0.5\ rpm}/\mu_{5\ rpm}$) of the viscosity ($\mu_{0.5\ rpm}$) of the adhesive at 0.5 rpm to a viscosity ($\mu_{5\ rpm}$) of the adhesive measured with the E-type viscometer at 5 rpm is 2 or more, and a gelation time of the adhesive expressed by a time to reach 2000 Pa·s with a viscosity measured with a dynamic viscoelastic measuring apparatus at 150° C. and revolutions of 1 Hz is 240 seconds or less.

12. The method manufacturing the stacked semiconductor device according to claim 11, wherein the adhesive contains spacer particles.

13. The method of manufacturing the stacked semiconductor device according to claim 12, wherein the spacer particles are insulating resin particles whose shape is maintained at a temperature for bonding the second semiconductor element.

14. The method of manufacturing the stacked semiconductor device according to claim 11, wherein the second semiconductor element is stacked on the first semiconductor element via a cured layer of the adhesive, with a gap of 15 µm or less being interposed between the first semiconductor element and the second semiconductor element.

15. The method of manufacturing the stacked semiconductor device according to claim 11, wherein the thermosetting resin composition contains a liquid resin composition and a thixotropic material whose content ratio to the liquid resin composition is 1 mass % or less (including zero).

16. The method of manufacturing the stacked semiconductor device according to claim 15, wherein the liquid resin composition contains thermosetting resin, a curing agent, and an inorganic filler.

17. The method of manufacturing the stacked semiconductor device according to claim 11, wherein the circuit base includes a wiring board or a lead frame.

18. The method of manufacturing the stacked semiconductor device according to claim 17, further comprising, forming external connection terminals made of solder balls on a surface, of the wiring board as the circuit base, opposite a surface having the connection parts.

19. The method of manufacturing the stacked semiconductor device according to claim 18, wherein when post-curing properties of the adhesive are measured according to JIS K7244-4 (1999) "Plastics—Determination of Dynamic Mechanical Properties Part 4: Tensile Vibration—Non-resonance Method", a storage modulus at 260° C. is in a range from 1 MPa to 300 MPa and a shear strength at 260° C. is 1 MPa or more.

20. The method of manufacturing the stacked semiconductor device according to claim 18, wherein a mass change ratio of the adhesive is 2% or less after the adhesive is left for 24 hours under an environment of an 85° C. temperature and an 85% humidity after being cured.

* * * * *